(12) United States Patent
Uh et al.

(10) Patent No.: US 6,391,736 B1
(45) Date of Patent: May 21, 2002

(54) METHOD FOR FABRICATING A CAPACITOR OF A SEMICONDUCTOR DEVICE AND A CAPACITOR MADE THEREBY

(75) Inventors: Hyung-Soo Uh; Sang-Ho Song, both of Seoul; Ki-Nam Kim, Ahnyang-shi, all of (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/704,763

(22) Filed: Nov. 3, 2000

(30) Foreign Application Priority Data

Nov. 5, 1999 (KR) .............................. 99-48931

(51) Int. Cl.[7] .............................................. H01L 21/20
(52) U.S. Cl. ........................ 438/396; 438/397; 438/398; 438/720; 438/723
(58) Field of Search ................................ 438/253–258, 438/296, 297, 396–399, 692, 706, 712, 720, 723, 724

(56) References Cited

U.S. PATENT DOCUMENTS 6,077,738 A * 6/2000 Lee et al. .................... 438/241
6,130,449 A * 10/2000 Matsuoka et al. ........... 257/296
6,200,855 B1 * 3/2001 Lee ............................. 438/255
6,200,898 B1 * 3/2001 Tu .............................. 438/692
6,222,722 B1 * 4/2001 Fukuzimi et al. ............ 361/305
6,333,225 B1 * 12/2001 Scheugraf et al. ........... 438/253

* cited by examiner

Primary Examiner—Benjamin L. Utech
Assistant Examiner—Duy-Vu Deo
(74) Attorney, Agent, or Firm—Lee & Sterba, P.C.

(57) ABSTRACT

A method for fabricating a capacitor of a semiconductor device, and a capacitor made in accordance with the method are disclosed. The method includes forming a plate electrode polysilicon layer on a semiconductor substrate having a cell array region and a core/peripheral circuit region. The plate electrode polysilicon layer in the cell array region is patterned to form an opening, wherein the inner wall of the opening is used as a plate electrode. After forming a dielectric layer in the opening, a storage node is formed as a spacer on the dielectric layer on the inner wall of the opening. The plate electrode polysilicon layer in the core/peripheral circuit region remains to provide the same height between the cell array region where the cell capacitor is formed and the core/peripheral circuit region.

9 Claims, 8 Drawing Sheets

METHOD FOR FABRICATING A CAPACITOR OF A SEMICONDUCTOR DEVICE AND A CAPACITOR MADE THEREBY

BACKGROUND OF THE INVENTION

1. Field of the Invention

The present invention relates to a semiconductor device and more particularly to a method for fabricating a CUB (capacitor under bit line) capacitor of a semiconductor device.

2. Description of the Related Art

The increasing need for high-speed operation requires high-speed memory devices. Furthermore, a memory device and a logic device typically are merged on the same wafer (so called MML (memory-merged-logic)) in order to construct a system with improved performance. Particularly, a dynamic random access memory (DRAM) and a logic device are merged on a single chip for low cost and high density.

A DRAM device usually comprises a cell array region and a peripheral circuit region. The cell in the cell array region stores binary information and the peripheral circuit drives the cell array, i.e., delivers the information stored in the cell array to the exterior. Accordingly, the cell capacitance of a cell capacitor that stores information plays a key role in the design of a semiconductor memory device. For example, the cell capacitance should be maintained at at least 25 fF to prevent a soft-error rate that can be caused by alpha-particle interference, and to prevent a data-error rate that can be caused by noise. Therefore, high-density techniques that integrate more devices in a given smaller cell area without reducing cell capacitance have become important techniques in the semiconductor memory industry.

However, such high density and high capacitance techniques can give rise to some problems. For example, a step (height difference) can be created between the cell array region where a cell capacitor is formed and the peripheral region, thereby making it difficult to perform a reliable photo-etching process. Accordingly, a CUB (capacitor-under-bit line) structure capacitor rather than a COB (capacitor-over-bit line) structure capacitor is widely used in order to reduce the step between the cell array region and the peripheral circuit region. However, the CUB structure capacitor also has some problems. Namely, in the CUB structure capacitor, an insulating layer formed on the peripheral circuit region is removed after a cell capacitor is formed on the cell array region. Thus, a step between the cell array region and the peripheral circuit region also can be created. Accordingly, it is important to re-form the insulating layer on the peripheral circuit region, and to planarize it for subsequent bit line formation.

In addition, an electrical bridge between storage nodes can arise in DRAM devices due to misalignment and an insufficient process margin caused by the recent ever-decreasing design rule for high memory device. The electrical bridge is a source of a twin bit failure or multi-bit failure, thereby blocking the high density DRAM. Increasing the distance between adjacent storage nodes can minimize the electrical bridge in a box type stack cell structure. The available surface area, however, is reduced too much thereby reducing the capacitance of the cell capacitor.

In an effort to solve the above-mentioned problems, recent disclosures have described making a cylindrical capacitor storage node by using a sacrificial oxide layer. This storage node structure has been called a concave structure. A contact for the lower electrode is formed in the sacrificial oxide layer, a conductive layer fills the contact, and each contact is separated. Finally, the sacrificial oxide layer is removed. The concave structure cell capacitor can further be divided into how the contact is filled with a polysilicon material. The first type of concave structure is one where the contact is completely filled (box type), and the second type of concave structure is one where the contact is partially filled (so-called cylindrical capacitor).

The cylindrical capacitor has some advantages associated with the twin bit failure, when compared to the box type. The cylindrical capacitor is not suitable for miniaturization like the box type, however, because the dielectric layer and the plate electrode are filled into the cylindrical contact. These problems can be severe when hemi-spherical grain (HSG) silicon is formed in the cylinder for high capacitance.

SUMMARY OF THE INVENTION

It is a feature of an embodiment of the present invention to provide a method for fabricating a capacitor that can reduce the step between the cell array region and the peripheral circuit region. It is another feature of an embodiment of the present invention to provide a method for fabricating a capacitor that can prevent misalignment of the storage node to the storage node contact, and that can prevent formation of an electrical bridge between adjacent storage nodes. It is an additional feature of an embodiment of the invention to provide a capacitor made by the method that does not have a step between the cell array region and the peripheral circuit region.

To achieve these and other features of the various embodiments of the invention, there is provide a method for fabricating a capacitor of a semiconductor device comprising first providing a semiconductor substrate having a cell array region and a core/peripheral region. At least one first gate line then is formed on the cell region of the semiconductor substrate, and a second gate line is formed on the core/peripheral region of the semiconductor substrate. A first interlayer insulating layer is formed over the first and second gate lines, thereby protecting the first and second gate lines from one another.

The first interlayer insulating layer is patterned in the cell region to expose the semiconductor substrate between the gate lines, and a storage node contact pad and a bit line contact pad are subsequently formed by filling the exposed area with a first conductive material. The method also comprises sequentially forming a second interlayer insulating layer, a second conductive material layer, and an oxide layer on the resulting structure having the storage node and bit line contact pads.

In accordance with the method, the oxide layer and the second conductive material layer are patterned to expose the second interlayer insulating layer over the storage node contact pad thereby forming an opening having sidewalls and a bottom. A dielectric layer and a third conductive layer are sequentially formed on the bottom and sidewalls of the opening. The method then comprises etching the third conductive layer until the dielectric layer on the bottom of the opening is exposed, thereby forming a conductive spacer on the dielectric layer on the sidewalls of the opening, and then subsequently etching the dielectric layer and the second interlayer insulating layer using the conductive spacer as a mask to expose the storage node contact pad. A fourth conductive layer then can be formed to electrically connect the conductive spacer to the storage node contact pad.

In accordance with the method, a third interlayer insulating layer is formed on the resulting structure having the oxide layer and the fourth conductive layer. The third interlayer insulating layer then is patterned together with the oxide layer, the second conductive layer the second interlayer insulating layer, and the first interlayer insulating layer to form a contact hole to the bit line contact pad in the cell array region, and to form a contact hole to the semiconductor substrate outside of the second gate line of the core/peripheral region. An insulating spacer then is formed in the contact hole, and a fifth conductive layer formed in the contact hole to form a contact plug. Finally, the method comprises forming a bit line on the third interlayer insulating layer thereby electrically connecting the bit line to the contact plug.

The present invention also relates to a capacitor of a semiconductor device that is prepared in accordance with the above-described method. The capacitor preferably includes a semiconductor substrate having a cell array region and a core/peripheral region, and at least two gate lines disposed on the semiconductor substrate in the cell array region. The capacitor is further comprised of a storage node contact pad disposed between the at least two gate lines, an opening filled with a fourth conductive material disposed above the storage node contact pad, a conductive spacer comprised of a third conductive material disposed adjacent the opening, a dielectric layer disposed adjacent to the conductive spacer, and a second conductive material layer disposed adjacent to the dielectric layer.

According to the above-mentioned method and capacitor, the opening for a storage node is formed as a contact hole type in a plate electrode. Namely, patterning the plate electrode simultaneously forms the opening for a storage node therein. Furthermore, the storage node comprised of the conductive spacer is formed in the contact hole, and using the spacer as a mask, the underlying layer is etched to an active region or pad. Accordingly, the number of photo-etching process can be reduced by more than half. In addition, since the storage node is formed in a self-aligned manner, misalignment of the storage node and electrical bridging between adjacent storage nodes can be prevented.

BRIEF DESCRIPTION OF THE DRAWINGS

The above features and advantages of the present invention will become more apparent by describing in detail preferred embodiments thereof with reference to the attached drawings in which.

DESCRIPTION OF PREFERRED EMBODIMENTS

Korean Patent Application No. 99-48931, filed on Nov. 5, 1999, and entitled "Method for Fabricating a Capacitor of a Semiconductor Device," is herein incorporated by reference in its entirety.

Preferred embodiments of the present invention will be fully described hereinafter with reference to the accompanying drawings. In the drawings, like reference numerals denote like embodiments. In the drawings, various preferred embodiments are shown, whereby the embodiments include a preferred number of elements. Skilled artisans will appreciate that any number of elements may be formed in the invention, using the guidelines provided herein. For example, while the drawings may show only one cell region and one core/peripheral region, more than one region may be formed, and each respective region may include any number of elements, like contact pads, bit line contacts, gate oxide layers, and the like.

In accordance with the invention, there is provided a method for fabricating a capacitor of a semiconductor device comprising first providing a semiconductor substrate having a cell array region and a core/peripheral region. At least one first gate line then is formed on the cell region of the semiconductor substrate, and a second gate line is formed on the core/peripheral region of the semiconductor substrate. A first interlayer insulating layer is formed over the first and second gate lines, thereby protecting the first and second gate lines from one another.

The first interlayer insulating layer is patterned in the cell region to expose the semiconductor substrate between the gate lines, and a storage node contact pad and a bit line contact pad are subsequently formed by filling the exposed area with a first conductive material. The method also comprises sequentially forming a second interlayer insulating layer, a second conductive material layer, and an oxide layer on the resulting structure having the storage node and bit line contact pads.

In accordance with the method, the oxide layer and the second conductive material layer are patterned to expose the second interlayer insulating layer over the storage node contact pad thereby forming an opening having sidewalls and a bottom. A dielectric layer and a third conductive layer are sequentially formed on the bottom and sidewalls of the opening. The method then comprises etching the third conductive layer until the dielectric layer on the bottom of the opening is exposed, thereby forming a conductive spacer on the dielectric layer on the sidewalls of the opening, and then subsequently etching the dielectric layer and the second interlayer insulating layer using the conductive spacer as a mask to expose the storage node contact pad. A fourth conductive layer then can be formed to electrically connect the conductive spacer to the storage node contact pad.

In accordance with the method, a third interlayer insulating layer is formed on the resulting structure having the oxide layer and the fourth conductive layer. The third interlayer insulating layer then is patterned together with the oxide layer, the second interlayer insulating layer, and the first interlayer insulating layer to form a contact hole to the bit line contact pad in the cell array region, and to form a contact hole to the semiconductor substrate outside of the second gate line of the core/peripheral region. An insulating spacer then is formed in the contact hole, and a fifth conductive layer formed in the contact hole to form a contact plug. Finally, the method comprises forming a bit line on the third interlayer insulating layer thereby electrically connecting the bit line to the contact plug.

It is preferred that the capacitor of the invention includes the second conductive layer, the dielectric layer and the conductive spacer, whereby the second conductive layer is a plate electrode layer, and the conductive spacer is a storage node. It also is preferred in the invention that an HSG silicon layer be formed on the bottom and sidewalls of the opening prior to forming the dielectric layer and the third conductive layer. Another embodiment of the invention provides a doped polysilicon layer as the second conductive layer, and a metal layer as the conductive spacer. More preferably, the metal layer is comprised of at least one metal selected from the group consisting of TiN, TiN/polysilicon, and mixtures thereof. It also is preferred in the invention that the insulating spacer be comprised of at least one component selected from the group consisting of a nitride, an oxide, and mixtures thereof.

In the above-mentioned method, in order to increase the surface area of the cell capacitor, it is preferred to pattern the second conductive layer to form the opening by forming a photoresist pattern on the oxide layer, and anisotropically etching the oxide layer using the photoresist pattern as a mask. This feature of the invention further comprises removing the photoresist pattern, isotropically etching the oxide layer, and anisotropically etching the second conductive layer to form the opening.

Alternatively, a method of increasing the surface area of the cell capacitor can be carried out by first forming an anti-reflection coating layer on the oxide layer, and then forming a photoresist pattern on the anti-reflection coating layer. The anti-reflection coating layer and the oxide layer then can be etched using the photoresist pattern as a mask, and the photoresist pattern subsequently removed. This feature of the invention further comprises wet etching the oxide layer to undercut a lateral side thereof, and etching the second conductive layer to form the opening.

In accordance with a preferred embodiment of the invention, the method further comprises forming a fourth interlayer insulating layer on the third interlayer insulating layer and the bit line. The method also preferably comprises patterning the fourth interlayer insulating layer, third interlayer insulating layer, and oxide layer to form a via contact, to expose the bit line of the core/peripheral region, and to expose the second conductive layer in the core/peripheral regions. Finally, the method comprises forming a sixth conductive layer on the via contact to form a metal line.

The present invention also relates to a capacitor of a semiconductor device that is prepared in accordance with the above-described method. The capacitor preferably includes a semiconductor substrate having a cell array region and a core/peripheral region, and at least two gate lines disposed on the semiconductor substrate in the cell array region. The capacitor is further comprised of a storage node contact pad disposed between the at least two gate lines, an opening filled with a fourth conductive material disposed above the storage node contact pad, a conductive spacer comprised of a third conductive material disposed adjacent the opening, a dielectric layer disposed adjacent to the conductive spacer, and a second conductive material layer disposed adjacent to the dielectric layer.

It is preferred in the invention that the second conductive material of the capacitor is a plate electrode layer, and that the conductive spacer is a storage node. More preferably the second conductive material is a doped polysilicon layer, and the conductive spacer is a metal layer. Even more preferably, the metal layer of the capacitor is comprised of at least one metal selected from the group consisting of TiN, TiN/polysilicon, and mixtures thereof.

The present invention relates to a method for fabricating a capacitor (preferably a cell capacitor), and to a capacitor made in accordance with the method. It is a feature of an embodiment of the present invention that doped polysilicon, which can be used as a plate electrode, is formed on a cell array region and a core/peripheral circuit region of a semiconductor substrate having contact pads for a storage node and a bit line. The plate polysilicon layer then can be patterned to form a plate electrode of a contact hole type (an opening). Namely, the opening for a storage node also is defined in the plate electrode. A storage node then can be formed as a spacer type in the inner wall of the plate electrode (i.e., in the opening) in a self-aligned manner. In accordance with this embodiment, the number of photolithography process can be reduced by more than half, and preferably reduced by more than three-fold. This embodiment also prevents the formation of an electrical bridge between adjacent storage nodes since the storage node is formed within the opening. The storage node preferably is made of a double layer structure of TiN and polysilicon, thereby reducing a depletion phenomenon of the polysilicon. In addition, the plate polysilicon layer in the core/peripheral circuit region preferably is not removed, but remains. Accordingly, no step is generated between the cell array region and the core/peripheral circuit region.

Figure 1:
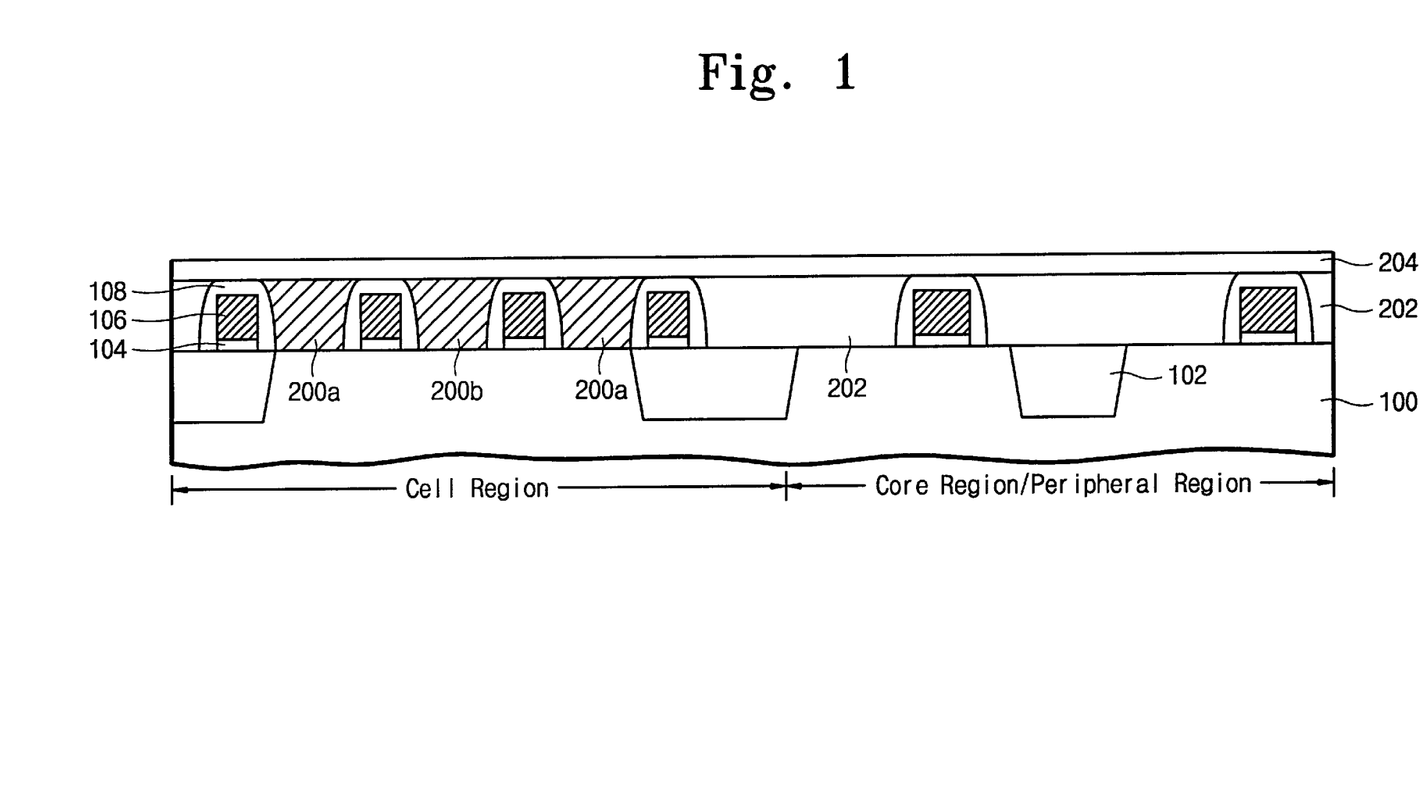
FIGS. 1 to 8 are cross-sectional views schematically illustrating a method for fabricating a capacitor of a semiconductor device at selected stages according to the present invention.

FIGS. 1 to 8 are cross-sectional views illustrating a semiconductor substrate at selected stages of a fabrication process of an embodiment of the present invention. FIG. 1 schematically shows a semiconductor substrate having undergone several process steps and thereby having at least one gate line, preferably at least two gate lines, a storage node contact pad, and a bit line contact pad, in accordance with the present invention. Referring now to FIG. 1, a semiconductor substrate 100 is provided. The semiconductor substrate 100 preferably is divided into a cell array region and a core/peripheral region. A device isolation process, such as a shallow trench isolation (STI) process then can be carried out to define active regions surrounded by an insulator (inactive region). Namely, a predetermined portion of the semiconductor substrate is etched to a predetermined depth to form a trench. The trench is filled with an insulator to form a trench isolation region 102. Those skilled in the art are capable of forming a trench isolation region using the guidelines provided herein.

The following process sequence describes the formation of a cell transistor. In this embodiment of the invention, it is preferred to carry out conventional ion implanting to form a well, and to adjust a threshold voltage. At least one and preferably at least two gate lines are formed in the cell array region and the core/peripheral circuit region in accordance with conventional procedures. For example, a gate oxide layer 104, a polysilicon layer 106, and a nitride layer 108 are sequentially formed on the semiconductor substrate 100 and then patterned to form the gate lines. Forming a layer of nitride on the gate lines, and on the semiconductor substrate 100, and then etching back the layer of nitride then can form a gate sidewall spacer. Herein, the polysilicon layer 106 can be replaced with a stacked layer of polysilicon and tungsten silicide. Source/drain regions then can be formed in the semiconductor substrate 100 lateral edges of the gate line by conventional ion implanting. The gate lines together with the source/drain constitute a transistor. Those skilled in the art are capable of forming gate lines, sidewall spacers, source/drain regions, and stacked polysilicon layers, using the guidelines provided herein.

A first interlayer insulating layer 202 then preferably is formed on the resulting structure and planarized. Contact pads 200a, 200b for storage node and bit lines then can be formed in the cell array region. Namely, the first interlayer insulating layer 202 is patterned to expose the semiconductor substrate 100 between the gate lines. The area exposed by etching the first interlayer insulating layer 202 then can be filled with a conductive material layer, such as a polysilicon material, to form a storage node contact pad 200a, and a bit line contact pad 200b. A second interlayer insulating layer 204 then can be formed on the resulting structure. Again, those skilled in the art are capable of forming contact pads 200a and bit line contact pads 200b, using the guidelines provided herein.

Figure 2:
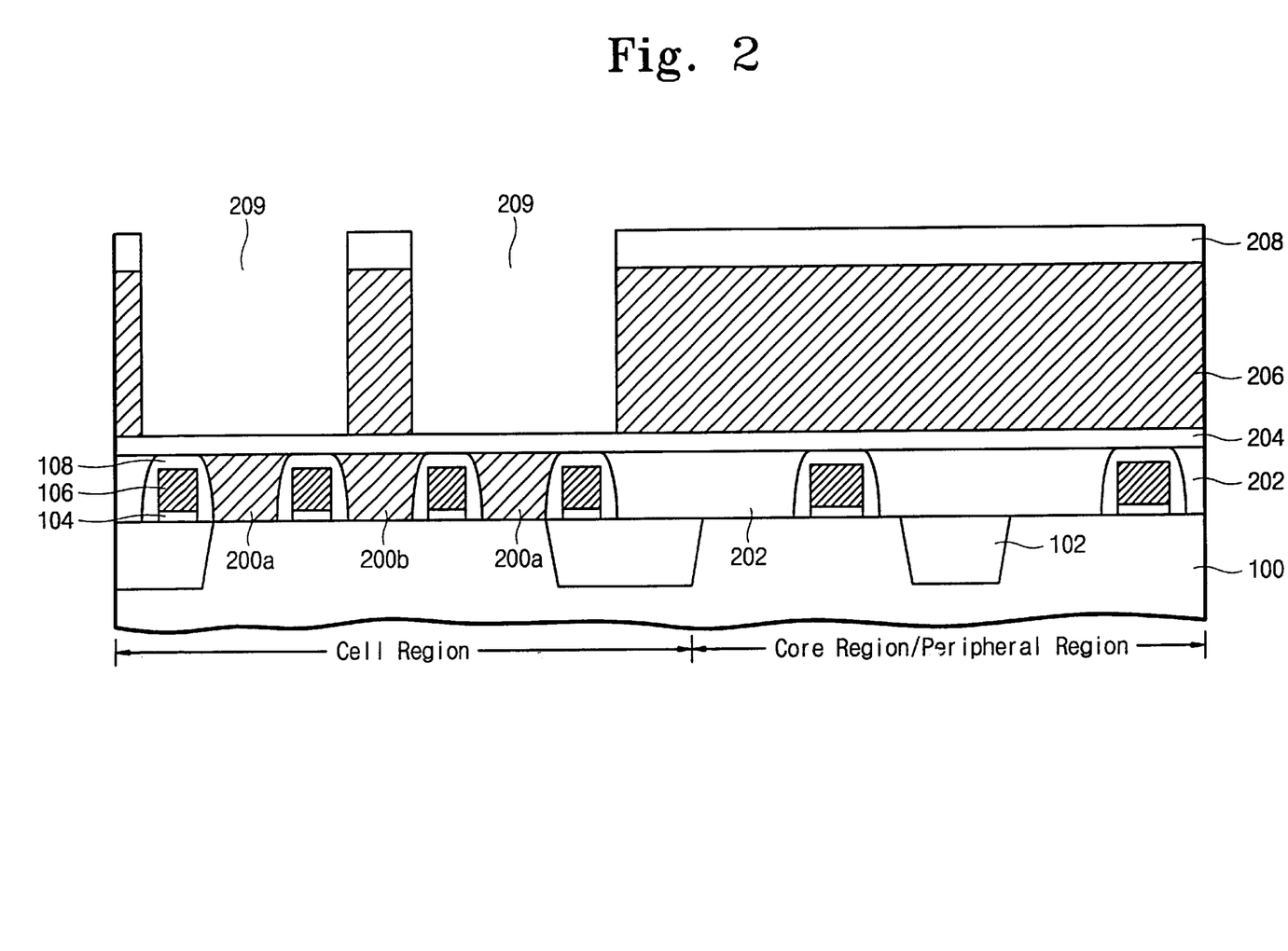
Figure 3:
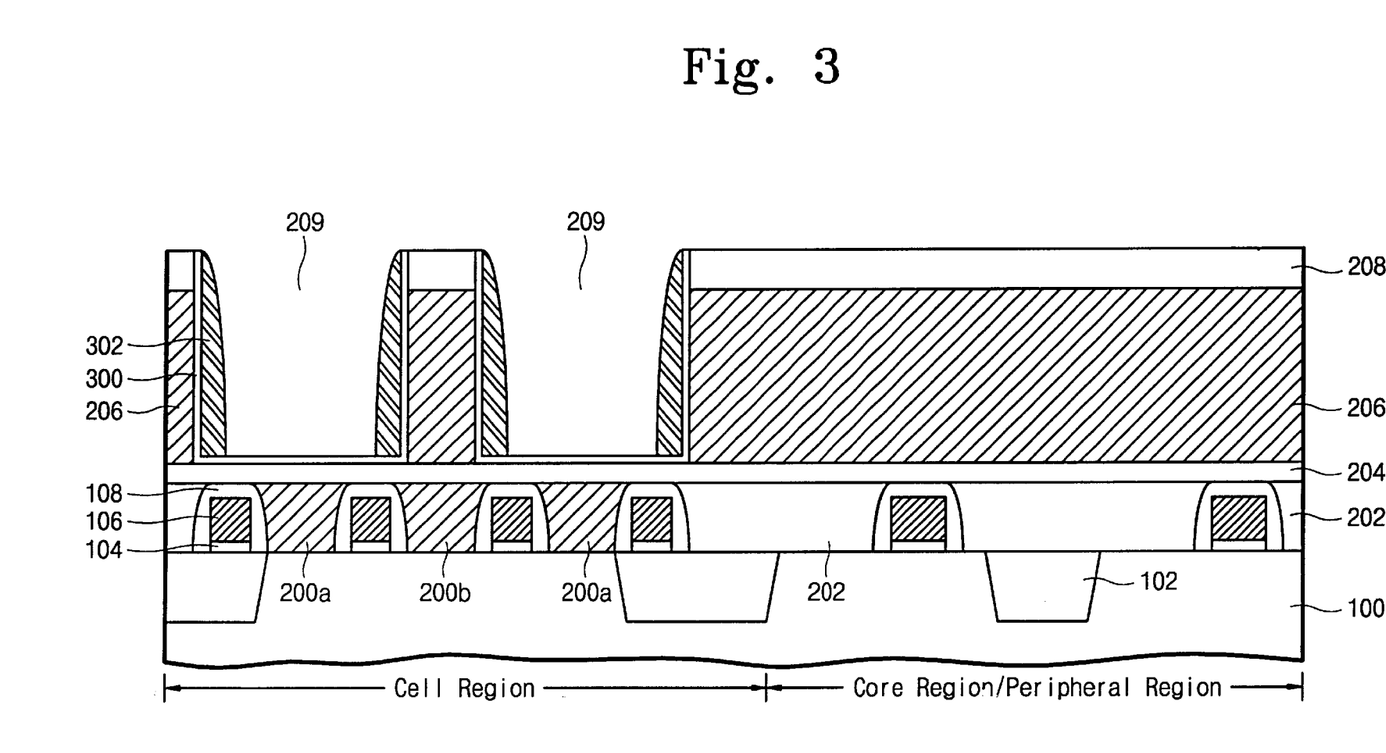
Figure 4:
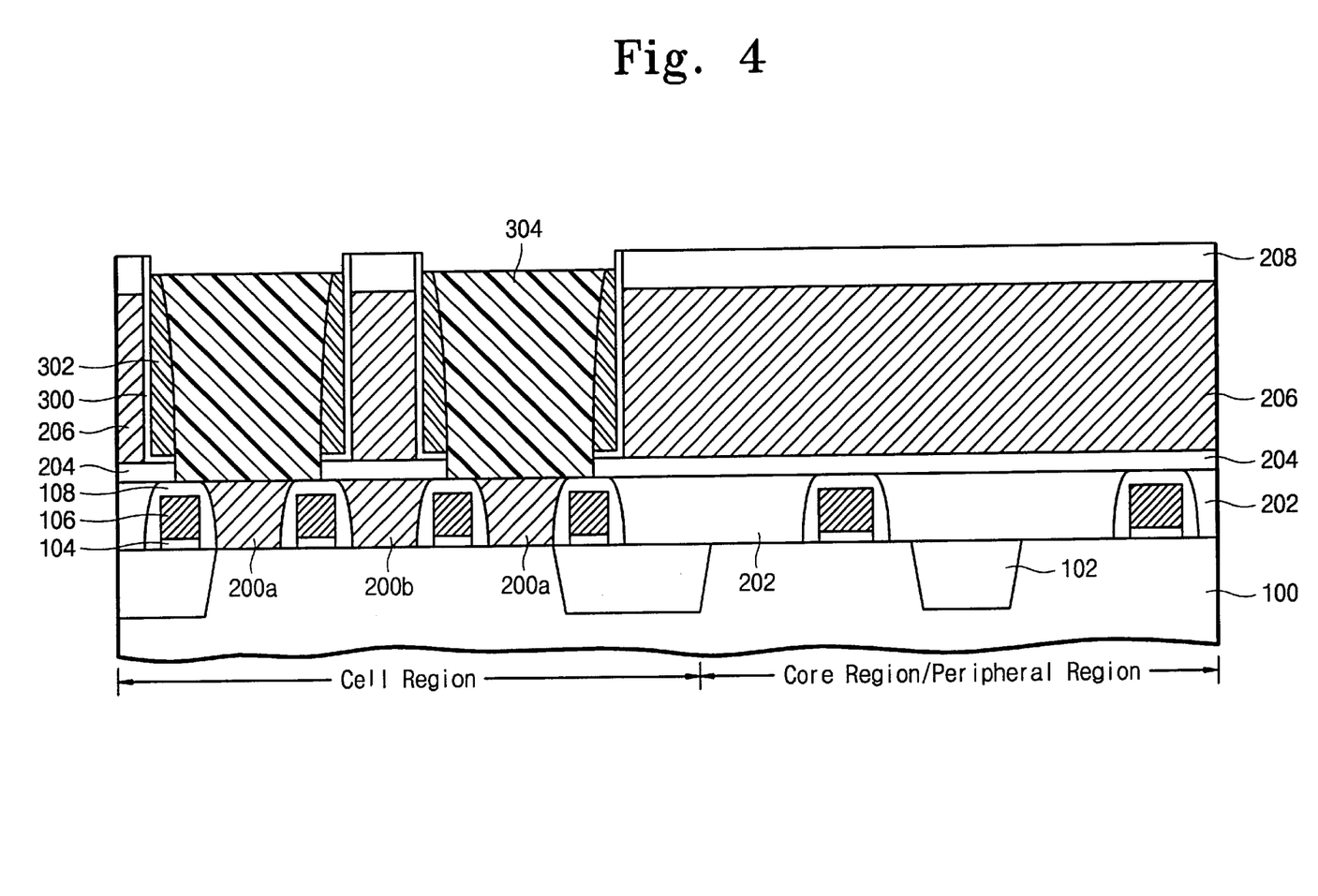

The next process sequence results in the formation of a cell capacitor, and is schematically shown in FIGS. 2 to 4. FIG. 2 schematically illustrates a process of forming a plate electrode. FIG. 3 schematically illustrates a process of forming a storage node. FIG. 4 schematically illustrates a process of forming an electrical connection between the storage node and the transistor.

More particularly, referring now to FIG. 2, a conductive material such as a doped polysilicon layer 206, useful as a plate electrode, can be is formed on the second interlayer insulating layer 204. An oxide layer 208 and a photoresist layer (not shown) then can be sequentially formed on the plate electrode polysilicon layer 206. Through exposure and development, the photoresist layer is patterned into a predetermined configuration. The oxide layer 208 then may be etched using the patterned photoresist layer as an etching mask, and the patterned photoresist layer subsequently removed. The plate electrode polysilicon layer 206 then can be etched using the oxide layer 208 as a mask until the second interlayer insulating layer 204 is exposed, thereby forming an opening 209. The interior of the thus formed opening 209 may be used as a plate electrode, since the sidewalls of opening 209 are comprised of the plate electrode polysilicon layer 206. This is a desirable feature of the present invention.

The plate electrode polysilicon layer 206 preferably is formed on the core/peripheral circuit region, as well as on the cell array region, and still remains on the core/peripheral circuit region during the subsequent processes. Accordingly, no step is generated between the cell array region and the core/peripheral region.

The size of the opening 209 can be increased in order to increase the surface area of the plate electrode (which results in an increase in the surface area of a subsequently formed storage node). To this end, the opening 209 formed in the plate electrode polysilicon layer 206 can be increased in size by isotropically etching the oxide layer 208. Those skilled in the art are capable of increasing the size of opening 209 using any means, using the guidelines provided herein.

For example, an anti-reflection coating layer (not shown) can be formed between the oxide layer 208 and the photoresist layer, described above. In this case, the anti-reflection coating layer and the oxide layer 208 may be anisotropically etched by using the patterned photoresist layer. After removing the patterned photoresist layer, the oxide layer 208 preferably is undercut by wet etching, using the anti-reflection coating layer as a mask. Namely, the oxide layer 208 under the anti-reflection coating layer is etched laterally. Then, the anti-reflection coating layer is removed. Using the undercut oxide layer, the plate electrode polysilicon layer 206 is etched to form the plate electrode whose surface area is increased (i.e., the size of the opening 209 is increased).

In addition, an HSG silicon layer further can be formed on the plate electrode polysilicon layer 206, i. e., in the opening inner wall in order to further increase the surface area of the electrode, thereby increasing capacitance. These and other methods may be used to increase the size of opening 209.

Referring now to FIG. 3, a dielectric layer 300 preferably is formed on the opening inner wall (e.g., on sidewalls of plate electrode polysilicon layer 206) and on the bottom of the opening 209. The dielectric layer 300 preferably is formed of any material having a high dielectric constant ($\in$). For example, $TiO_2$ ($\in=70\sim80$), $Ta_2O_5$ ($\in=24\sim26$), $ZrO_2$ ($\in=15\sim20$), $Nb_2O_5$ ($\in=10\sim21$), $StTiO_3$ ($\in=200\sim300$), BST ($\in=300\sim500$), and the like, can be used in the present invention.

In order to form a storage node, a conductive layer, such as a TiN/polysilicon layer can be formed on the dielectric layer 300, on the bottom and inner walls of the opening 209. The conductive layer then can be anisotropically etched until the dielectric layer 300 on the bottom of the opening 209 is exposed, thereby forming a conductive spacer 302 on the dielectric layer 300 on the inner wall of the opening. The conductive spacer 302 can be used as a storage node. Those skilled in the art will appreciate that any other method capable of forming spacer 302 on the dielectric layer 300 on the inner walls of opening 209 can be used in the present invention.

As described above, according to the present invention, the storage node is formed after forming the plate electrode polysilicon layer 206. Namely, after the plate electrode polysilicon layer 206 is formed as a contact hole-type (i.e., the opening 209), the storage node is formed on the inner walls of the contact hole in a self-aligned manner. Accordingly, the process of the invention reduces the number of photolithography processes required to form the respective components by more than half and preferably by more than three times, when compared to conventional methods. In other words, only one photolithography process is required to form the storage node contact, storage node, and plate electrode. In addition, electrical bridges that may exist between adjacent storage nodes are inherently prevented since the storage node is formed in a self-aligned manner on the inner wall of the opening.

Referring now to FIG. 4, the dielectric layer 300 on the bottom of the contact hole 209, and the second interlayer insulating layer 204 over the storage node contact pad 200a can be sequentially etched by using the conductive spacer 302 as an etching mask. This etching process forms an electrical connection between the conductive spacers (storage node) 302 and the storage node contact pad 200a, (e.g., forms a storage node contact hole). A conductive material (fourth conductive layer), such as a doped polysilicon layer 304, then can be formed on the oxide layer 208 and on the cell array region to fill the opening 209 and the storage node contact hole, thereby electrically connecting the conductive spacer 302 for a storage node to the storage node contact pad 200a. The doped polysilicon 304 preferably is etched until the oxide layer 208 is exposed, to electrically isolate by a unit cell.

Figure 5:
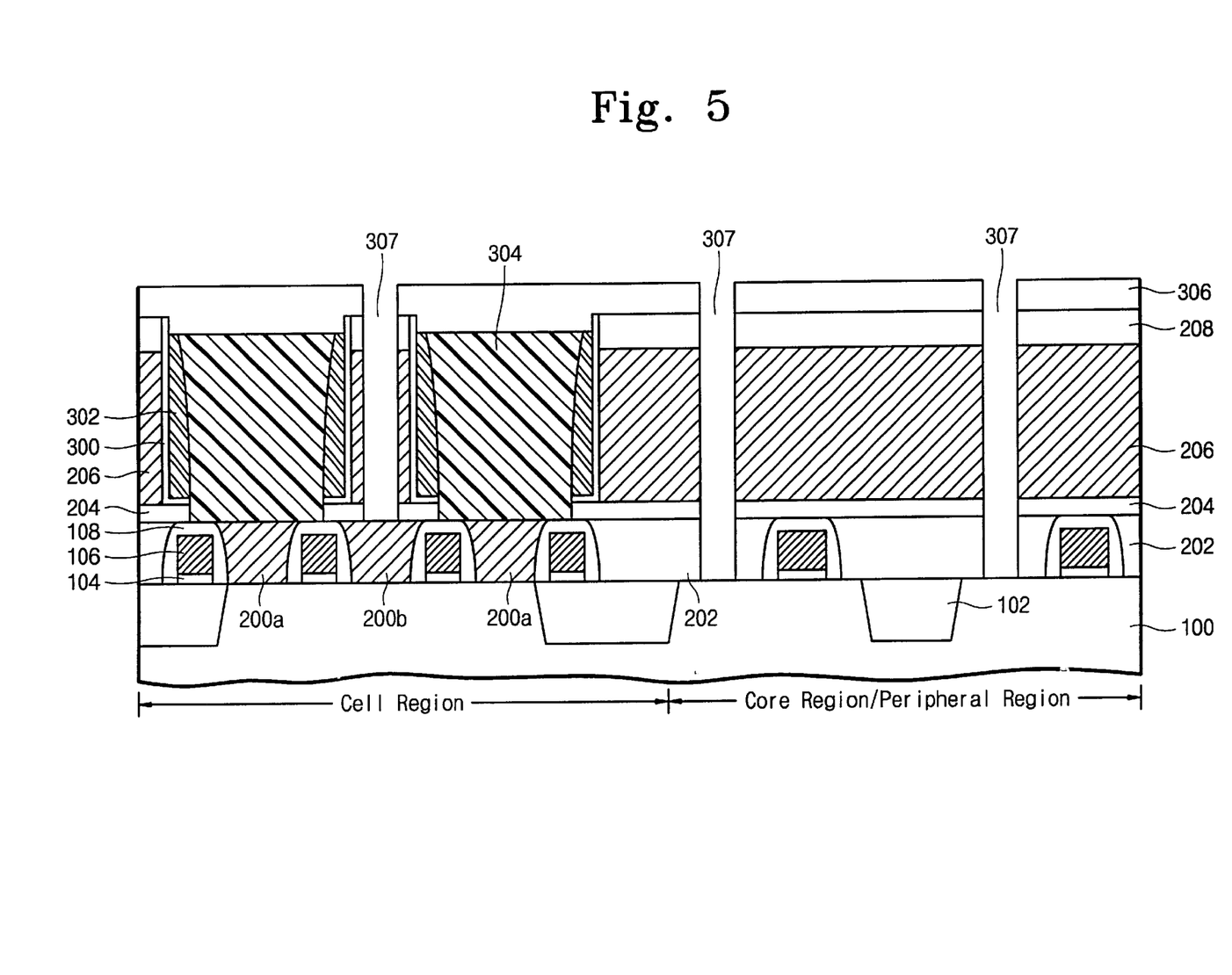
Figure 6:
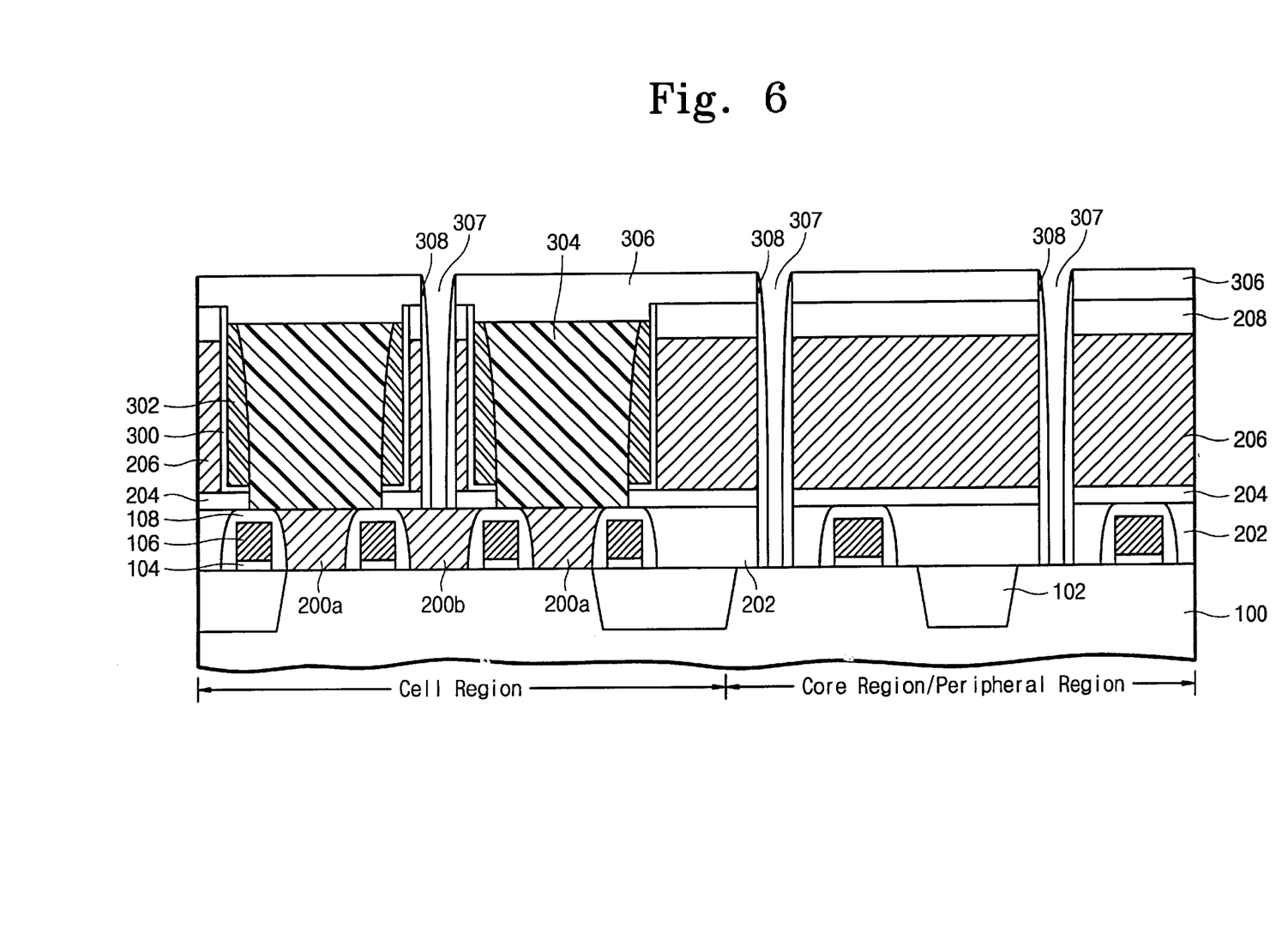
Figure 7:
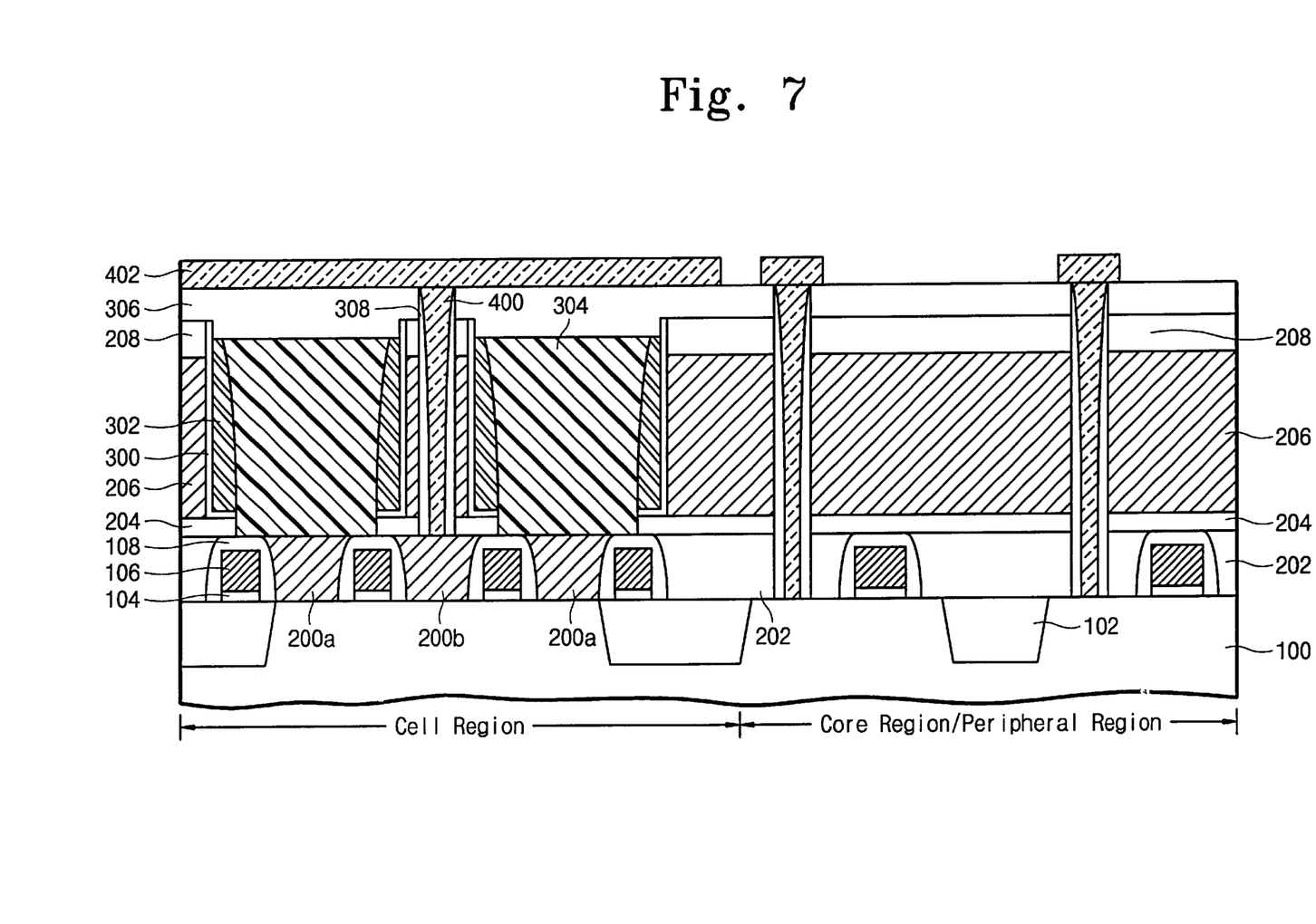

FIGS. 5 to 7 illustrate the next process sequences useful in forming a contact plug to electrically connect the transistor and the bit line, and the process sequences useful in forming a bit line over the contact plug. As shown in FIGS. 5 to 7, there is no step between the cell array region and the core/peripheral circuit region since the plate electrode polysilicon layer 206 remains at the core/peripheral circuit region. This configuration provides an excellent surface topology for photolithography and for a metal interconnection. In addition, since the plate electrode is formed of a doped polysilicon and the storage node is formed of a metal layer of TiN/polysilicon, decrease in capacitance caused by the storage node depletion phenomenon encountered in conventional method using polysilicon storage node can be prevented.

Referring now to FIG. 5, a third interlayer insulating layer 306 preferably is formed on the entire surface of the semiconductor substrate having the cell capacitor. A photoresist layer pattern (not shown) then can be formed on the third interlayer insulating layer 306. The third interlayer insulating layer 306, the oxide layer 208, the plate electrode polysilicon layer 206, the second interlayer insulating layer 204, and the first interlayer insulating layer 202 can be etched using the photoresist layer pattern as a mask. Etching the respective layers in this manner forms a contact hole for formation of a contact plug, and respectively exposes the bit line contact pad 200b in the cell array region and the semiconductor substrate 100 in the core/peripheral circuit region.

FIG. 6 illustrates a process sequence to electrically insulate the plate electrode polysilicon layer 206 by forming an insulating spacer in the contact hole for the contact plug. Any method can be used to electrically insulate the plate electrode polysilicon layer 206 and form an insulating spacer. For example, an oxide or nitride layer (308) may be deposited in the contact hole for the contact plug and then anisotropically etched to form the insulating spacer 308 on the inner wall of the contact hole.

Referring now to FIG. 7, a conductive material such as polysilicon or tungsten preferably is deposited in the contact hole that now is insulated from the plate electrode polysilicon layer 206 by the insulating spacer. The deposited conductive material then can be etched back to form a contact plug 400. After forming the contact plug 400, a conductive material such as $TiSi_2$/TiN/W can be sequentially formed on the third interlayer insulating layer 306 and on the contact plug 400. The stacked layers then can be patterned to form a bit line 402. As described above, since the bit line is formed after the formation of the cell capacitor, the bit line is directly connected to both the cell region and the core/peripheral region, thereby simplifying the fabrication process. In addition, the bit line material is not subject to capacitor high temperature annealing.

Figure 8:
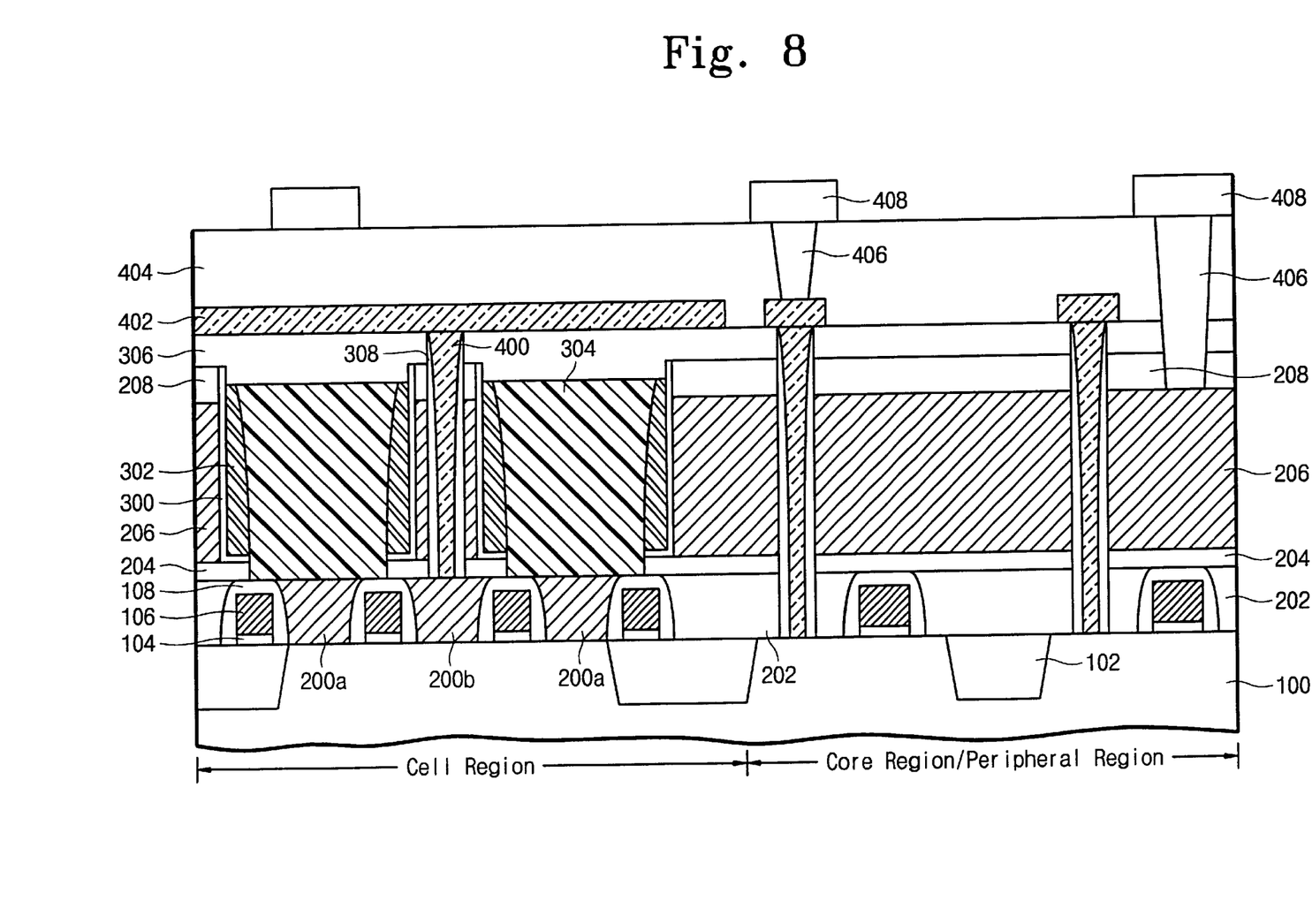

Referring to FIG. 8, a fourth interlayer insulating layer 404 preferably is formed on the third interlayer insulating layer 306 and on the bit line 402. Via hole 406 and metal line 408 then can be formed using techniques known in the art. The metal line 408 is directly connected to the bit line 402 and plate electrode polysilicon layer 206.

It will be apparent to those skilled in the art that the innovative concepts disclosed in the present application can be applied in a wide variety of contexts. Moreover, the preferred embodiments described above may be modified in a variety of ways. Accordingly, it should be understood that various modifications might be made to the invention without departing from the spirit and scope of the invention.

What is claimed is:

1. A method for fabricating a capacitor of a semiconductor device comprising:

providing a semiconductor substrate having a cell array region and a core/peripheral region;

forming at least one first gate line on the cell region of the semiconductor substrate;

forming a second gate line on the core/peripheral region of the semiconductor substrate;

forming over the first and second gate lines a first interlayer insulating layer thereby protecting the first and second gate lines from one another;

patterning the first interlayer insulating layer in the cell region to expose the semiconductor substrate between the gate lines;

forming a storage node contact pad and a bit line contact pad by filling the exposed area with a first conductive material;

sequentially forming a second interlayer insulating layer, a second conductive material layer, and an oxide layer on the resulting structure having the storage node and bit line contact pads;

patterning the oxide layer and the second conductive material layer to expose the second interlayer insulating layer over the storage node contact pad thereby forming an opening having sidewalls and a bottom;

sequentially forming a dielectric layer and a third conductive layer on the bottom and sidewalls of the opening;

etching the third conductive layer until the dielectric layer on the bottom of the opening is exposed, thereby forming a conductive spacer on the dielectric layer on the sidewalls of the opening;

etching the dielectric layer and the second interlayer insulating layer using the conductive spacer as a mask to expose the storage node contact pad;

forming a fourth conductive layer to electrically connect the conductive spacer and the storage node contact pad;

forming a third interlayer insulating layer on the resulting structure having the fourth conductive layer and the oxide layer;

patterning the third interlayer insulating layer, oxide layer, second conductive layer, second interlayer insulating layer, and first interlayer insulating layer to form a contact hole to the bit line contact pad in the cell array region, and to form a contact hole to the semiconductor substrate outside of the second gate line of the core/peripheral region;

forming an insulating spacer in the contact hole;

forming a fifth conductive layer in the contact hole to form a contact plug; and forming a bit line on the third interlayer insulating layer thereby electrically connecting the bit line to the contact plug.

2. The method according to claim 1, wherein the capacitor includes the second conductive layer, the dielectric layer and the conductive spacer, wherein the second conductive layer is a plate electrode layer, and the conductive spacer is a storage node.

3. The method according to claim 1, further comprising forming a hemi-spherical grain (HSG) silicon layer on the bottom and sidewalls of the opening prior to forming the dielectric layer and the third conductive layer.

4. The method according to claim 2, wherein the second conductive layer is a doped polysilicon layer, and the conductive spacer is a metal layer.

5. The method according to claim 4, wherein the metal layer is comprised of at least one metal selected from the group consisting of TiN, TiN/polysilicon, and mixtures thereof.

6. The method according to claim 1, wherein the insulating spacer is comprised of at least one component selected from the group consisting of a nitride, an oxide, and mixtures thereof.

7. The method according to claim 1, wherein patterning the second conductive layer to form the opening comprises:

forming a photoresist pattern on the oxide layer;

anisotropically etching the oxide layer using the photoresist pattern as a mask;

removing the photoresist pattern and isotropically etching the oxide layer; and anisotropically etching the second conductive layer to form the opening.

8. The method according to claim 1, wherein patterning the second conductive layer to form the opening comprises:

forming an anti-reflection coating layer on the oxide layer;

forming a photoresist pattern on the anti-reflection coating layer;

etching the anti-reflection coating layer and the oxide layer using the photoresist pattern as a mask;

removing the photoresist pattern, and wet etching the oxide layer to undercut a lateral side thereof; and etching the second conductive layer.

9. The method according to claim 1, further comprising:

forming a fourth interlayer insulating layer on the third interlayer insulating layer and the bit line;

patterning the fourth interlayer insulating layer, third interlayer insulating layer, and oxide layer to form a via hole, and to expose the bit line of the core/peripheral region, and to expose at least a portion of the second conductive layer in the core/peripheral regions; and forming a sixth conductive layer on the via contact to form a metal line.

\* \* \* \* \*